(12) United States Patent
Huang

(10) Patent No.: US 11,978,502 B2
(45) Date of Patent: May 7, 2024

(54) INPUT SAMPLING METHOD, INPUT SAMPLING CIRCUIT AND SEMICONDUCTOR MEMORY

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 185 days.

(21) Appl. No.: 17/651,421

(22) Filed: Feb. 16, 2022

(65) Prior Publication Data

US 2023/0010338 A1 Jan. 12, 2023

Related U.S. Application Data

(63) Continuation of application No. PCT/CN2021/112921, filed on Aug. 17, 2021.

(30) Foreign Application Priority Data

Jul. 7, 2021 (CN) .......................... 202110766193.1

(51) Int. Cl.
*G11C 11/408* (2006.01)
*G11C 11/4076* (2006.01)
*H03K 19/20* (2006.01)

(52) U.S. Cl.
CPC ...... *G11C 11/4087* (2013.01); *G11C 11/4076* (2013.01); *G11C 11/4082* (2013.01); *H03K 19/20* (2013.01)

(58) Field of Classification Search
CPC ............ G11C 11/4087; G11C 11/4076; G11C 11/4082; H03K 19/20

USPC ...................................................... 365/230.06
See application file for complete search history.

(56) References Cited

U.S. PATENT DOCUMENTS

| 8,686,884 | B2 | 4/2014 | Baumgartner |
| 8,837,639 | B2 | 9/2014 | Cordos |
| 9,389,953 | B2 | 7/2016 | Choi |
| 9,705,507 | B1 | 7/2017 | Jain |
| 2006/0039214 | A1 | 2/2006 | Yamasaki |
| 2007/0101177 | A1 | 5/2007 | Kuroki |
| 2013/0076396 | A1 | 3/2013 | Rao |

(Continued)

FOREIGN PATENT DOCUMENTS

| CN | 1737896 A | 2/2006 |
| CN | 100397529 C | 6/2008 |
| CN | 102347813 A | 2/2012 |

(Continued)

OTHER PUBLICATIONS

Non Final Office Action of the U.S. Appl. No. 17/657,580, filed Feb. 2, 2024. 83 pages.

*Primary Examiner* — Huan Hoang
(74) *Attorney, Agent, or Firm* — Syncoda LLC; Feng Ma

(57) ABSTRACT

An input sampling method includes the following operations. A first pulse signal and a second pulse signal are received. Logical operation is performed on the first pulse signal and the second pulse signal to determine a to-be-sampled signal. The to-be-sampled signal is obtained by shielding an invalid part of the second pulse signal according to a logical operation result. Sampling process is performed on the to-be-sampled signal to obtain a target sampled signal.

15 Claims, 6 Drawing Sheets

(56) References Cited

U.S. PATENT DOCUMENTS

2015/0055695 A1* 2/2015 Huang .................... H04B 1/06
375/238
2019/0361820 A1* 11/2019 Ware .................. G06F 13/1615

FOREIGN PATENT DOCUMENTS

| CN | 106055496 A | 10/2016 |
| CN | 108429456 A | 8/2018 |
| JP | 2006332945 A | 12/2006 |
| JP | 2014154910 A | 8/2014 |

* cited by examiner

INPUT SAMPLING METHOD, INPUT SAMPLING CIRCUIT AND SEMICONDUCTOR MEMORY

CROSS-REFERENCE TO RELATED APPLICATIONS

This is a continuation of International Application No. PCT/CN2021/112921 filed on Aug. 17, 2021, which claims priority to Chinese Patent Application No. 202110766193.1 filed on Jul. 7, 2021. The disclosures of the above-referenced applications are hereby incorporated by reference in their entirety.

BACKGROUND

Dynamic Random-Access Memory (DRAM) is a semiconductor memory device commonly used in computers, which is composed of many repeated storage units. At present, with increasing more fields of DRAM application, users have higher and higher requirements on the DRAM power consumption index.

SUMMARY

Embodiments of the present disclosure relate to, but are not limited to, an input sampling method, an input sampling circuit and a semiconductor memory.

In a first aspect, embodiments of the present disclosure provide an input sampling method. The method includes the following operations.

A first pulse signal and a second pulse signal are received.

Logical operation is performed on the first pulse signal and the second pulse signal to determine a to-be-sampled signal. The to-be-sampled signal is obtained by shielding an invalid part of the second pulse signal according to a logical operation result.

Sampling process is performed on the to-be-sampled signal to obtain a target sampled signal.

In a second aspect, embodiments of the present disclosure provide an input sampling circuit. The input sampling circuit includes a first signal input terminal, a second signal input terminal, a logical operator and a first sampling sub-circuit.

The first signal input terminal is configured to receive a first pulse signal.

The second signal input terminal is configured to receive a second pulse signal.

The logical operator is configured to perform logical operation on the first pulse signal and the second pulse signal to obtain a to-be-sampled signal. The to-be-sampled signal is obtained by shielding an invalid part of the second pulse signal according to a logical operation result.

The first sampling sub-circuit is configured to perform sampling process on the to-be-sampled signal to obtain a target sampled signal.

Two input terminals of the logical operator are connected to the first signal input terminal and the second signal input terminal respectively. An output terminal of the logical operator is connected to the first sampling sub-circuit.

In a third aspect, embodiments of the present disclosure provide a semiconductor memory. The semiconductor memory includes the input sampling circuit in the second aspect.

DETAILED DESCRIPTION

Figure 1:
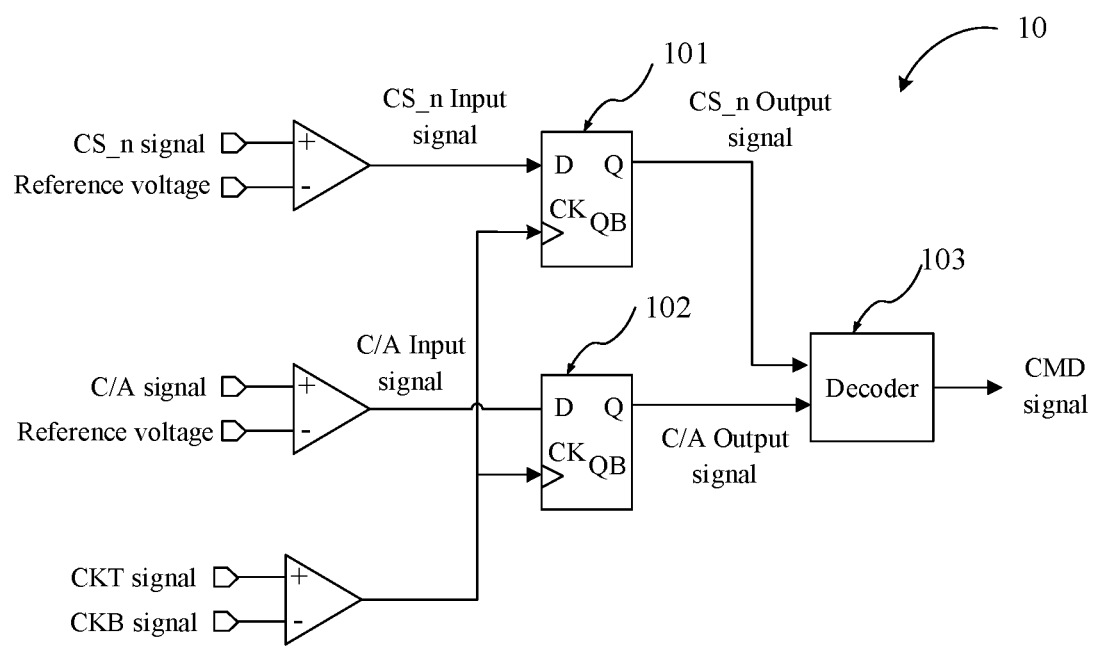
FIG. 1 illustrates a schematic structural diagram of an input sampling circuit provided in some implementations.

The technical scheme of the embodiments of the present disclosure will be clearly and completely described below with reference to the drawings of the embodiments of the present disclosure. It should be understood that the specific embodiments described herein are merely illustrative of the relevant disclosure and are not limiting of the disclosure. It should be further noted that, for the convenience of description, only parts relevant to the related disclosure are shown in the drawings.

Unless otherwise defined, all technical and scientific terms used herein have the same meaning as commonly understood by those of ordinary skill in the art to which the disclosure belongs. The terms used herein are merely for the purpose of describing the embodiments of the present disclosure and not intend to limit the present disclosure.

In the following description, "some embodiments" describe subsets of all possible embodiments, but it should be understood that "some embodiments" may be same or different subsets of all possible embodiments, and may be combined with each other on a non-conflict basis.

It should be noted that terms "first/second/third" are used merely to distinguish similar objects and do not denote particular sequencing, and it should be understood that "first/second/third" may be interchanged under appropriate circumstances in order to enable the embodiments of the present disclosure described herein to be implemented in other sequences than those illustrated or described herein.

The explanation of the technical terms in the embodiments of the present disclosure and the corresponding relationship of some terms will be described below.

The sampling process means that the amplitude of input signal is measured at regular time intervals, and the analog signal with continuous time is converted into the sampled signals with discrete time and continuous amplitude.

The DDR is Double Data Rate SDRAM (DDR SDRAM).

Command/Address input sampling system is also called C/A input sampling system, and input sampling circuit. The Command/Address input sampling system uses a standard clock signal to perform sampling process on a C/A signal, so as to facilitate instruction decoding.

DIMM is Dual Inline Memory Modules.

The decoder (DEC) is a device used for performing decoding process.

The latch is a device which performs sampling process at certain time and keeps a sampled result at an output terminal.

The first pulse signal is also called CS_n signal and is used for indicating a Chip Select (CS) signal. The CS signal is used to select whether a current device is a target device.

The second pulse signal is also called C/A signal and is used for indicating the Command/Address signal. The Command/Address signal is an input signal including commands, addresses and other information, which is used for controlling a specific device in a circuit.

The standard clock signal is a standard signal in signal process, such as a CKT signal and CKB signal.

The to-be-sampled signal is also called C/A Input signal and is used for indicating the signal obtained after performing operation on the first pulse signal and the second pulse signal.

The target sampled signal is also called C/A Output signal is used for indicating the signal obtained after performing sample on the to-be-sampled signal.

The sampled first pulse signal is also called Cs_n Output signal and is used for indicating the signal obtained after performing sampling process on the first pulse signal.

The target signal is also called CMD signal and is used for indicating the signal obtained by performing decoding process on the target sampled signal when the first pulse signal is valid.

At present, in the C/A input sampling system of the DRAM, the C/A signal and the standard clock signal enter the input sampling circuit through a receiver respectively, then the C/A signal is performed sampling process by the standard clock signal, and then the synchronized sampled C/A signal is output for subsequent instruction decoding. However, according to the DRAM DIMM design, a C/A data bus is shared by multiple DRAMs, and the DRAM targeted by the C/A signal needs to be distinguished by the CS signal.

That is, in the DRAM DIMM, multiple DRAMs are arranged, and each DRAM is provided with a corresponding input sampling circuit. For an input sampling circuit of a specific DRAM, besides the C/A signal, the CS signal also enters the input sampling circuit through a receiver and is performed sampling process by the standard clock signal. Whether the C/A signal is invalid instructions for the DRAM is determined according to the CS signal. That is, whether the C/A signal is valid needs to be determined according to the CS signal.

In some DRAM, the invalid input signal may cause the level state to flip, and then lead to excessive power consumption.

FIG. 1 illustrates a schematic structural diagram of an input sampling circuit 10 provided in some implementations. As shown in FIG. 1, the C/A signal and standard clock signal (CKT signal/CKB signal) are performed sampling process through a a second latch 102 to obtain a C/A Output signal, and the CS_n signal and standard clock signal are performed sampling process through a first latch 101 to obtain a Cs_n Output signal, and then, a decoder 103 performs decoding process on the CS_n Output signal according to the C/A Output signal, the CMD signal is obtained finally, and the DRAM is controlled by the CMD signal subsequently.

That is, all received C/A signals are processed in an instruction decoding module together with the CS signal. If the CS_n signal is 0, then the C/A signal is targeted at the DRAM, then the C/A signal is performed decoding process, and further the instruction decoding is successful, and the subsequent execution flow proceeds. If the CS_n signal 1, then the DRAM is not a target DRAM, no instructions will be performed decoding process, and no subsequent actions will be performed.

Figure 2:
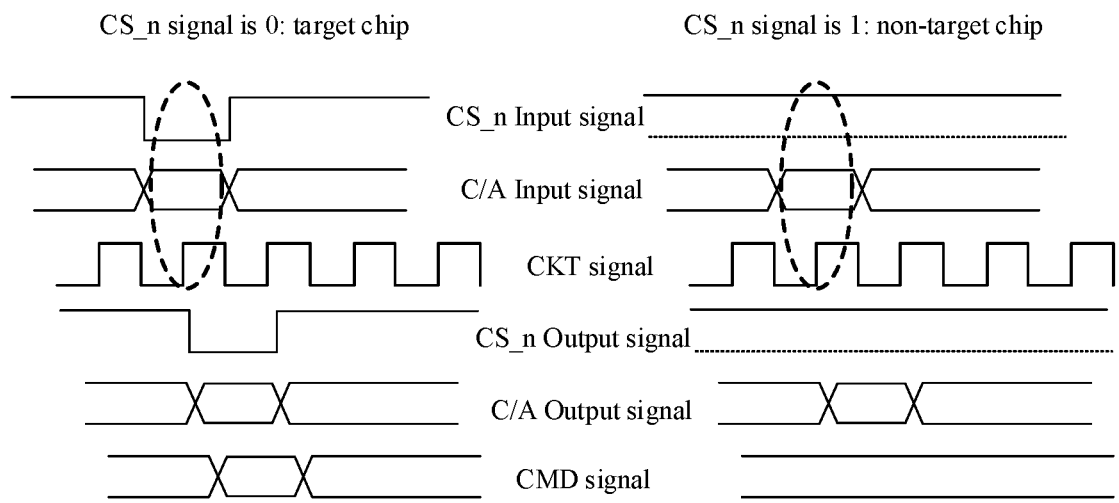
FIG. 2 illustrates a schematic diagram of signal variation of an input sampling circuit provided in some implementations.

However, even if the CS_n signal is 1 and the C/A signal is invalid for the DRAM, the input sampling circuit 10 still performs sampling process on the C/A signal. With reference to FIG. 2, FIG. 2 illustrates a schematic diagram of signal variation of an input sampling circuit in some implementations. As shown by the dotted-line circle in FIG. 2, even if the CS_n signal is 1 (the DRAM is a non-target chip), the C/A Output signal will still vary with the C/A signal. The C/A signal is usually multi-bit, and the C/A Output signal needs to keep varying with the C/A signal, thereby leading to a large amount of useless energy consumption in the input sampling circuit.

Therefore, for the DRAM DIMM including multiple DRAMs, each specific DRAM may repeat sampling of the C/A signal, so that many input sampling circuits may cause unnecessary energy consumption.

Thereon, embodiments of the present disclosure provide an input sampling method. According to basic principle of the method, the input sampling method includes the following steps. A first pulse signal and a second pulse signal are received. Logical operation is performed on the first pulse signal and the second pulse signal to determine a to-be-sampled signal. The to-be-sampled signal is obtained by shielding an invalid part of the second pulse signal according to a logical operation result. Sampling process is performed on the to-be-sampled signal to obtain a target sampled signal. For the input sampling circuit, the input sampling circuit includes a second signal input terminal, a logical operator and a first sampling sub-circuit. The first signal input terminal is used for receiving a first pulse signal. The second signal input terminal is used for receiving a second pulse signal. The logical operator is used for performing logical operation on the first pulse signal and the second pulse signal to obtain a to-be-sampled signal. The to-be-sampled signal is obtained by shielding an invalid part of the second pulse signal according to a logical operation result. The first sampling sub-circuit is used for performing sampling process on the to-be-sampled signal to obtain a target sampled signal. Two input terminals of the logical operator are connected to the first signal input terminal and the second signal input terminal respectively, and an output terminal of the logical operator is connected to the first sampling sub-circuit. In this way, by performing logical operation on the first pulse signal and the second pulse signal, the invalid part of the second pulse signal can be shielded, and the to-be-sampled signal will not be flipped over in level state along with the invalid input signal, thereby reducing the power and energy consumption of the input sampling circuit.

Embodiments of the present disclosure will be described in detail below with reference to the drawings.

Figure 3:
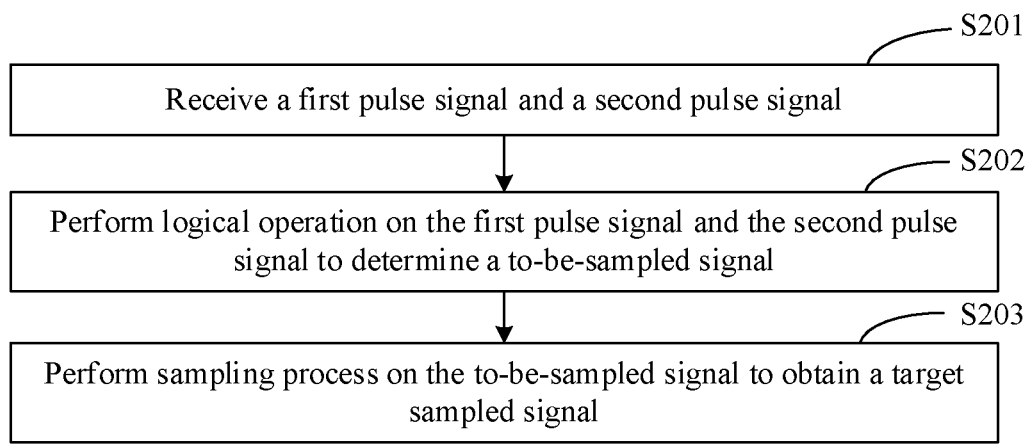
FIG. 3 illustrates a schematic flow diagram of an input sampling method provided by the embodiments of the present disclosure.

According to an embodiment of the present disclosure, with reference to FIG. 3, FIG. 3 illustrates a schematic structural diagram of an input sampling method provided by the embodiment of the present disclosure. As shown in FIG. 3, the method may include the following steps.

In step S201, the first pulse signal and the second pulse signal are received.

In step S202, logical operation is performed on the first pulse signal and the second pulse signal to determine a to-be-sampled signal.

It should be noted that the embodiment of the present disclosure is applied to a Command/Address input sampling system (i.e., an input sampling circuit) in an integrated circuit, such as a circuit system in which fixed clock signal (CKT signal) samples C/A input signal in a DRAM chip.

For convenience of illustration, the embodiments of the present disclosure are illustrated below by taking the C/A input sampling circuit of the DRAM as an example, which should not limit embodiments of the present disclosure. The method and circuit provided by the embodiments of the present disclosure may further be applied to any system relating to instruction acquisition or low power consumption.

According to the input sampling method, after receiving the first pulse signal and the second pulse signal, logical operation is performed on the first pulse signal and the second pulse signal, so that the invalid part of the second pulse signal is shielded and the to-be-sampled signal is obtained finally. That is, the to-be-sampled signal is obtained by shielding the invalid part of the second pulse signal according to the logical operation result.

Herein, the first pulse signal can generally indicate whether the second pulse signal is valid, and therefore a corresponding logical operation process may be designed to shield the invalid part of the second pulse signal.

Further, according to some embodiments, the method may further include the following steps.

When the logical operation result indicates that the second pulse signal is invalid, the level state of the to-be-sampled signal is determined to be shielded to be a preset value.

When the logical operation result indicates that the second pulse signal is valid, the level state of the to-be-sampled signal is determined to be the same as the level state of the second pulse signal.

It should be noted that if the second pulse signal is invalid, the level state of the to-be-sampled signal can be shielded to be the preset value, and if the second pulse signal is valid, the level state of the to-be-sampled signal needs to be the same as the level state of the second pulse signal, so as to ensure that the valid signals in the second pulse signal can normally play a role in controlling.

Therefore, in the sampling process, the invalid part of the second pulse signal is shielded to be the preset value, so that the to-be-sampled signal will not be flipped over in level state according to the invalid signal in the second pulse signal, thereby avoiding unnecessary energy consumption.

Further, according to some embodiments, the step of performing logical operation on first pulse signal and second pulse signal to determine the to-be-sampled signal may include the following operations.

The logical NOT operation is performed on the second pulse signal to obtain a processed second pulse signal.

The logical NOR operation is performed on the first pulse signal and the processed second pulse signal to obtain the to-be-sampled signal.

It should be noted that according to the embodiments of the present disclosure, the specific process of logical operation includes the steps. After receiving the first pulse signal and the second pulse signal, logical NOT operation is performed on the second pulse signal to obtain the processed second pulse signal. Then, the first pulse signal and the processed second pulse signal are subjected to logical NOR operation to obtain the to-be-sampled signal. It should be understood that the foregoing is merely a feasible way of the logical operation and should not limit the embodiments of the present disclosure.

The input sampling circuit of the DRAM is taken as an example to illustrate the logical operation process in detail below.

In the DRAM, the first pulse signal may be a Cs_n signal, and the second pulse signal may be a C/A signal. According to the industry standard of the DRAM, when the CS signal is 0, the C/A signal corresponding to the CS signal is a valid signal, and when the CS signal is 1, the C/A signal corresponding to the CS signal is an invalid signal.

After receiving the CS signal and the C/A signal, the CS signal may be subjected to logical NOT operation to obtain the processed second pulse signal. The C/A signal and the processed second pulse signal are subjected to logical NOR operation to obtain the to-be-sampled signal. In this way, when the CS signal is 1, the to-be-sampled signal are always 0. That is, the to-be-sampled signal will not be flipped over along with the C/A signal. When the CS signal is 0, the level state of the to-be-sampled signal will vary with the first pulse signal.

Therefore, in the logical operation process, when the CS signal is at high level, the logical operation result can indicate that the second pulse signal is invalid; and when the CS signal is at low level, the logical operation result can indicate that the second pulse signal is valid In this way, the to-be-sampled signal will only be flipped over along with the valid C/A signal, while the invalid C/A signal will be shielded, thereby avoiding meaningless energy consumption.

In step S303, sampling process is performed on the to-be-sampled signal to obtain the target sampled signal.

It should be noted that the to-be-sampled signal is performed sampling process to obtain the target sampled signal, so as to implement the subsequent control process.

Further, according to some embodiments, the step of performing sampling process on the to-be-sampled signal to obtain the target sampled signal may include the following operations.

A standard clock signal is received.

Sampling process is performed on the to-be-sampled signal by using the standard clock signal to obtain the target sampled signal.

It should be noted that in the sampling process, the standard clock signal needs to be received, sampling process is performed on the to-be-sampled signal by using the standard clock signals, and the target sampled signal is obtained finally.

Further, according to some embodiments, the method may further include the following operation.

Decoding process is performed on the target sampled signal to obtain the target signal.

It should be noted that after the target sampled signal is obtained, the target sampled signal needs to be performed decoding process to obtain the target signal, and the target signal is specifically used to control the DRAM.

Specifically, according to some embodiments, the step of performing decoding process on the target sampled signal to obtain the target signal may include the following operations.

The sampled first pulse signal is determined. The sampled first pulse signal is obtained by performing sampling process on the first pulse signal by using the standard clock signal.

Decoding process is performed on the target sampled signal according to the sampled first pulse signal to obtain the target signal.

It should be noted that in the decoding process, sampling process is performed on the first pulse signal by using the standard clock signal to obtain the sampled first pulse signal, and then, the decoding process is performed on the target sampled signal based on the sampled first pulse signal to ensure the correctness of decoding, and finally the target signal is obtained.

To sum up, by means of the circuit design provided by the embodiments of the present disclosure, the effect of reducing power consumption can be implemented by shielding the sampled input by the input sampling circuit when the invalid C/A signals are endlessly input.

An embodiment of the present disclosure provides an input sampling method, and the method includes the following operations. The first pulse signal and the second pulse signal are received. Logical operation is performed on the first pulse signal and the second pulse signal to determine the to-be-sampled signal. The to-be-sampled signal is obtained by shielding an invalid part of the second pulse signal according to a logical operation result. Sampling process is performed on the to-be-sampled signal to obtain a target sampled signal. In this way, by performing logical operation on the first pulse signal and the second pulse signal, the invalid part of the second pulse signal can be shielded, so that the to-be-sampled signal will not be flipped over in level state along with the invalid signal in the first pulse signal, thereby reducing the power and energy consumption of the input sampling circuit.

Figure 4:
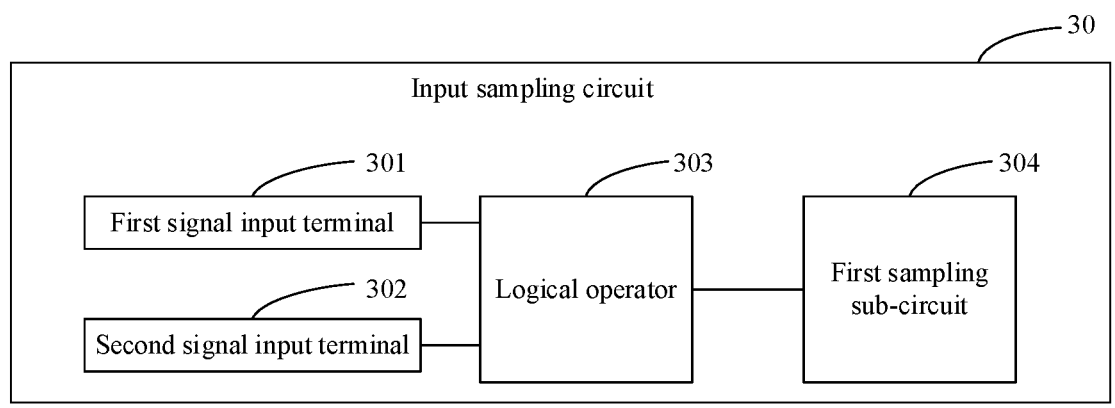
FIG. 4 illustrates a schematic structural diagram of an input sampling circuit provided by the embodiments of the present disclosure.

According to another embodiment of the present disclosure, with reference to FIG. 4, FIG. 4 illustrates a schematic structural diagram of an input sampling circuit 30 provided by the embodiments of the present disclosure. As shown in FIG. 4, the input sampling circuit 30 may include a first signal input terminal, a second signal input terminal, a logical operator and a first sampling sub-circuit.

The first signal input terminal 301 is configured to receive a first pulse signal.

The second signal input terminal 302 is configured to receive a second pulse signal.

The logical operator 303 is configured to perform logical operation on the first pulse signal and the second pulse signal to obtain a to-be-sampled signal. The to-be-sampled signal is obtained by shielding an invalid part of the second pulse signal according to a logical operation result.

The first sampling sub-circuit 304 is configured to perform sampling process on the to-be-sampled signal to obtain a target sampled signal.

It should be noted that the input sampling circuit belongs to an integrated circuit, such as a Command/Address input sampling circuit of a DRAM.

The embodiments of the present disclosure provide an input sampling circuit 30, and the input sampling circuit 30 includes the first signal input terminal 301, the second signal input terminal 302, the logical operator 303 and the first sampling sub-circuit 304. The specific connection relationship of the foregoing devices is that two input terminals of the logical operator 303 are connected to the first signal input terminal 301 and the second signal input terminal 302 respectively, and the output terminal of the logical operator 303 is connected to the first sampling sub-circuit 304.

Herein, the signal input terminal 301 is configured to receive the first pulse signal and the signal input terminal 302 is configured to receive the second pulse signal. Then, the logical operator 303 performs logical operation on the first pulse signal and the second pulse signal to obtain the to-be-sampled signal. Finally, the first sampling sub-circuit 304 performs sampling process on the operated input signal to obtain target sampled signals. In this way, since the to-be-sampled signal is obtained by shielding the invalid part of the second pulse signal according to the logical operation result, the input sampling circuit can be prevented from being meaninglessly flipped over in level state, thereby reducing the power consumption of the DRAM.

Further, according to some embodiments, a logical operator 303 may include a NOT gate and a NOR gate.

The NOT gate is configured to perform logical NOT operation on second pulse signal to obtain processed second pulse signal.

The NOR gate is configured to perform logical NOR operation on first pulse signal and the processed second pulse signal to obtain to-be-sampled signal.

It should be noted that the logical operator 303 includes the NOT gate and the NOR gate. An input terminal of the NOT gate is connected to the second signal input terminal, a first signal input terminal of the NOR gate is connected to a first signal input terminal, and a second signal input terminal of the NOR gate is connected to an output terminal of the NOT gate. In this way, the logical NOT operation is performed on the second pulse signal through the NOT gate to obtain the processed second pulse signal. Then, the logical NOR operation is performed on the first pulse signal and the processed second pulse signal through the NOR gate to obtain the to-be-sampled signal.

Taking the foregoing DRAM as an example, the first pulse signal refers to the CS signal, and the second pulse signal refers to the C/A signal. If the CS signal is 0, the C/A signal is valid, and the level state of the to-be-sampled signal is the same as the level state of the C/A signal, which ensures that the valid C/A signal can normally play a role in controlling the DRAM. If the CS signal is 1, the C/A signal is invalid, and the level state of the to-be-sampled signal is 0 constantly. That is, the to-be-sampled signal will not be flipped over along with the invalid C/A signal, thereby reducing the power and energy consumption.

Further, according to some embodiments, a first sampling sub-circuit may include a third signal input terminal and a first sampler, the third signal input terminal is connected to a clock port of the first sampler, and an input terminal of the first sampler is connected to an output terminal of a logical operator.

The third signal input terminal is configured to receive a standard clock signal.

The first sampler is configured to perform sampling process on the to-be-sampled signal by using the standard clock signal to obtain target sampled signal.

It should be noted that the sampling process needs to use the standard clock signal as reference. Therefore, the first sampling circuit 304 may include the third signal input terminal and the first sampler. The third signal input terminal is configured to receive the standard clock signal, and then, the first sampler uses the standard clock signal to perform sampling process on the operated input signals to obtain the target sampled signal. Herein, the first sampler may be a latch.

Further, the input sampling circuit 30 may further include a second sampling sub-circuit, and the second sampling sub-circuit may include a fourth signal input terminal and a second sampler, the fourth signal input terminal is connected to a clock port of the second sampler, and an input terminal of the second sampler is connected to a first signal input terminal.

The fourth signal input terminal is configured to receive a standard clock signal.

The second sampler is configured to perform sampling process on the first pulse signal by using the standard clock signal to obtain the sampled first pulse signal.

It should be noted that not only the input sampling circuit needs to perform sampling process on the second pulse signal, but also performing sampling process on the first pulse signal, so that correct decoding for the first pulse signal can be implemented according to the second pulse signal in the subsequent decoding process.

Therefore, the input sampling circuit 30 further includes the second sampling circuit, the second sampling circuit includes the fourth signal input terminal and the second sampler, the fourth signal input terminal is configured to receive the standard clock signal, and the second sampler is configured to perform sampling process on the first pulse signal by using the standard clock signal to obtain the sampled first pulse signal. Herein, the second sampler may be a latch.

In general, the first pulse signals and the second pulse signal need to be performed sampling process based on the standard clock signal of same frequency. Therefore, a clock signal input terminal may be used as both a third signal input terminal and a fourth signal input terminal.

After the foregoing processing, when the second pulse signal is valid, the target sampled signal obtained by sampling the second pulse signal and the sampled first pulse signal obtained by sampling the first pulse signal can be determined. Therefore, according to some embodiments, the input sampling circuit 30 further includes a decoder, and two input terminals of the decoder are connected to an output terminal of a first sampling sub-circuit and an output terminal of a second sampling sub-circuit respectively.

The decoder is configured to perform decoding process on the target sampled signal according to the sampled first pulse signal to obtain the target signal.

It should be noted that the input sampling circuit 30 may further include the decoder, so that decoding process is performed on the target sampled signal according to the sampled first pulse signal to obtain the target signal, thereby facilitating the DRAM to complete corresponding operation instructions according to the target signals.

To sum up, according to the input sampling circuit provided by the embodiments of the present disclosure, only when the first pulse signal is valid, the to-be-sampled signal will be flipped over in level state along with the first pulse signal. That is, the input sampling circuit will only perform sampling process on the valid second pulse signal and consume energy, thereby avoiding meaningless energy consumption. It should be understood that the structure of the logical operator described above is merely illustrative, and actually, the logical operator 303 may perform various logic combinations using an AND gate, an OR gate, a NOT gate, a NAND gate, a NOR gate, an XNOR gate, an XOR gate, and the like to implement the foregoing effects, all of which are within the scope of the embodiments of the present disclosure.

The embodiments of the present disclosure provide an input sampling circuit, and the input sampling circuit includes a first signal input terminal, a second signal input terminal, a logical operator, and a first sampling sub-circuit. The first signal input terminal is configured to receive the first pulse signal. The second signal input terminal is configured to receive the second pulse signal. The logical operator is configured to perform logical operation on the first pulse signal and the second pulse signal to obtain a to-be-sampled signal. The to-be-sampled signal is obtained by shielding a valid part of the second pulse signal according to a logical operation result. The first sampling sub-circuit is used for performing sampling process on the to-be-sampled signal to obtain a target sampled signal. Therefore, by performing logical operation on the first pulse signal and the second pulse signal, the valid part of the second pulse signal can be shielded, so that the to-be-sampled signal will not be flipped over in level state along with the valid signal in the first pulse signal, thereby reducing the power and energy consumption of the input sampling circuit.

Figure 5:
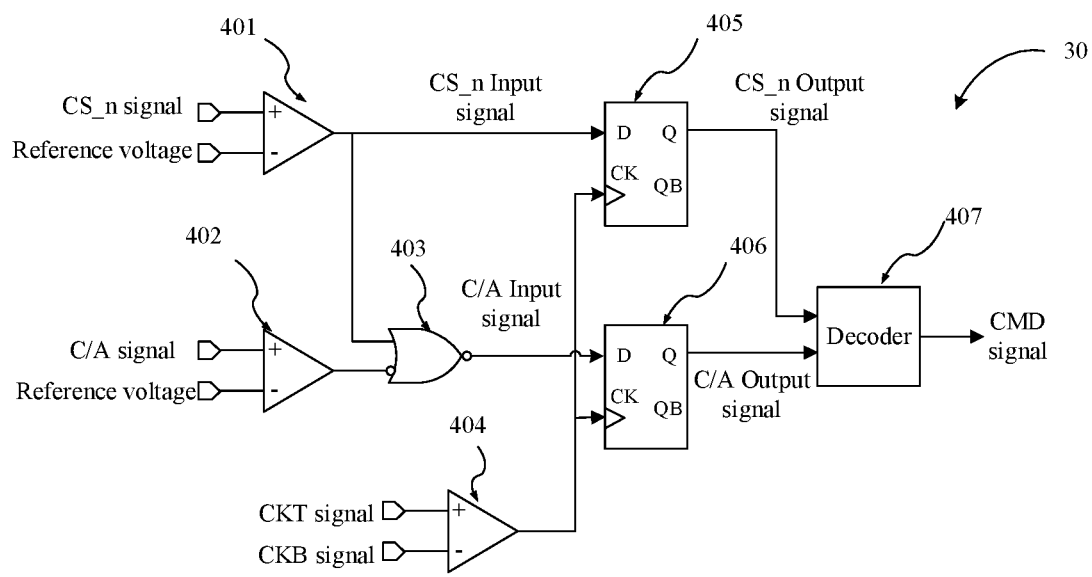
FIG. 5 illustrates a schematic structural diagram of another input sampling circuit provided by the embodiments of the present disclosure.

According to another embodiment of the present disclosure, a C/A input sampling circuit in a DRAM is taken as an example to specifically illustrate the foregoing method and the circuit structure. With reference to FIG. 5, FIG. 5 illustrates a schematic structural diagram of another input sampling circuit 30 provided by the embodiments of the present disclosure.

As shown in FIG. 5, the input sampling circuit 30 includes a first signal input terminal 401, a second signal input terminal 402, a logical operator 403, a clock signal input terminal 404, a first latch 405, a second latch 406, and a decoder 407. The clock signal input terminal 404 and the first latch 405 constitute the foregoing first sampling sub-circuit. The clock signal input terminal 404 and the second latch 406 constitute the foregoing second sampling sub-circuit.

The first signal input terminal 401, the second signal input terminal 402 and the clock signal input terminal 404 are all inherently receivers. Herein, the first signal input terminal 401 is used for receiving external CS_n signal and reference (VREFCA) signal to obtain received CS_n signal. The second signal input terminal 402 is used for receiving external C/A signal and VREFCA signal to obtain received C/A signal. The clock signal input terminal 404 is used for receiving standard clock signal (CKT signal/CKB signal). It should be understood that the "CS_n signal" is compared with the reference voltage to form "the received CS_n signal". That is, the waveforms and functions of the CS_n signal and the received CS_n signal are substantially identical, and both refer to CS signal. Therefore, similarly, the waveforms and functions of the C/A signal and the received C/A signal are substantially identical.

The logical operator 403 is connected to the first signal input terminal 401 and the second signal input terminal 402, and is used for performing logical operation on the CS_n signal and the received C/A signal to obtain C/A Input signal.

The first latch 405 is connected to the first signal input terminal 401 and the clock signal input terminal 404, and performs sampling process on the CS_n Input signal (i.e., the received CS_n signal) by using the standard clock signal to obtain CS_n Output signal. That is, the received CS_n signal is directly performed sampling process as a CS_n Input signal.

The second latch 406 is connected to the logical operator 403 and the clock signal input terminal 404, and performs sampling process on the C/A Input signal by using the standard clock signal to obtain the C/A Output signal. That is, the received C/A Input signal needs to be performed sampling process after operation together with the received CS_n signal.

The decoder 407 is connected to the first latch 405 and the second latch 406, and performs decoding process on the C/A Output signal based on the CS_n Output signal to obtain a CMD signal (corresponding to the foregoing target signal).

According to the embodiments of the present disclosure, when the CS_n signal is 0, the C/A signal is valid; and when the CS_n signal is 1, the C/A signal is invalid. Therefore, the logical operator 403 includes a NOT gate and a NOR gate to perform logical NOT operation on the received CS_n signal, and then perform logic NOR operation on the received C/A signal together with logical operation result to obtain the C/A Input signal. The logical operation formula is shown in equation (1).

$$C/A \text{ Input} = \overline{(\overline{Cs\_n\text{Input}} + \overline{C/A})} \tag{1}$$

Figure 6:
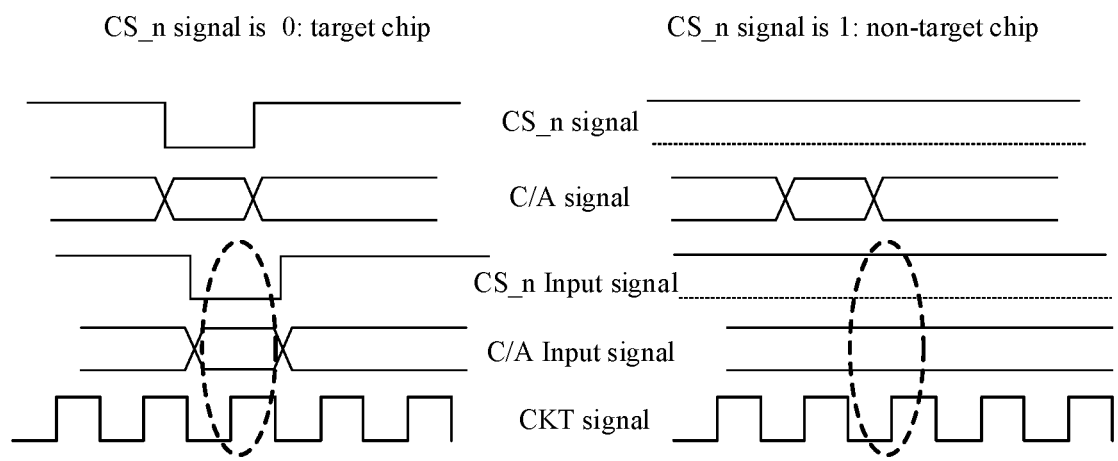
FIG. 6 illustrates a schematic diagram of signal variation of an input sampling circuit provided by the embodiments of the present disclosure.

With reference to FIG. 6, FIG. 6 illustrates a schematic diagram of signal variation of an input sampling circuit provided by the embodiments of the present disclosure. As shown in FIG. 6, when the CS_n signal is 0 (the DRAM is a target chip), the C/A Input signal will vary with the C/A signal, and the decoded CMD signal can reflect the instruction content of the C/A signal. When CS_n signal is 1 (the DRAM is a non-target chip), the C/A Input signal is 0 constantly as shown by the dotted-line circle, and will not be flipped over along with the C/A signal, so as to avoid meaningless power and energy consumption.

That is, the C/A Input signal of the non-target DRAM is shielded by CS_n signal, so that the value of C/A Input signal of the non-target DRAM does not vary, and the power consumption of the C/A sampling system is reduced. Combined logical operation for selection needs to be performed on the C/A signal of the target DRAM and the CS_n (CS) signal. Therefore, according to the C/A input sampling system, if the DRAM does not receive valid CS_n signal, the C/A signal will be shielded and the C/A signal is 0 constantly. In this way, even if there are external C/A signal, no data is flipped over in the internal C/A sampling system when the valid CS_n signal is not received, thereby saving the power consumption of the C/A sampling system.

Therefore, by means of the circuit design provided by the embodiments of the present disclosure, the purpose of reducing power consumption can be implemented by shielding the sampling input by the input sampling circuit when the invalid C/A signal is endlessly input. It should be understood that the C/A input sampling system of the DRAM is merely a specific application scenario shown in the embodiments of the present disclosure, which should not limit the embodiments of the present disclosure, and the circuit design can be applied to systems relating to instruction acquisition and low power consumption.

To sum up, the embodiments of the present disclosure provide an input sampling circuit. By inserting a control logical gate related to CS_n Input between the input terminal of the C/A receiver and the C/A sampling circuit, when the CS_n Input signal is 0, the C/A Input signal is normally transmitted and is performed sampling process by the subsequent CKT signal, and when CS_n Input signal is 1, the C/A Input signal is shielded to be 0 constantly, after which the CKT signal will not be flipped over during sampling process.

In this way, when the CS_n signal is 1 and the DRAM is the non-target chip, the C/A Input signal will be shielded before being sampled by CKT signal, making the C/A Input signal to be 0 constantly, thereby reducing the current consumption caused by flipped over of invalid input signal in the C/A sampling process. Since each DRAM in the C/A data bus is provided with a separate input sampling circuit, that is, multiple repeated sampling modules are arranged, the embodiments of the present disclosure can greatly reduce the circuit power consumption.

The embodiments of the present disclosure provide an input sampling circuit. The specific implementations of the foregoing embodiments are described in detail through the embodiments. It should be seen that the invalid part of the second pulse signal can be shielded by logical operation on the first pulse signal and the second pulse signal, so that the to-be-sampled signal will not be flipped over in level state along with the invalid signal in the first pulse signal, thereby reducing the power and energy consumption of the input sampling circuit.

Another embodiment of the present disclosure provides a semiconductor memory. The semiconductor memory includes at least the foregoing input sampling circuit 30.

The semiconductor memory includes the input sampling circuit 30, the invalid part of the second pulse signal can be shielded by performing logical operation on first pulse signal and the second pulse signal, thereby the to-be-sampled signal will not be flipped over in level state along with the invalid signal in the first pulse signal, thereby reducing the power and energy consumption of the input sampling circuit.

Further, the semiconductor memory may be a DRAM.

The foregoing is merely a description of the preferred embodiments of the present disclosure and is not intended to limit the scope of the present disclosure.

It should be noted that, according to the present disclosure, the terms "comprising," "including," or any other variation thereof, are intended to be non-exclusive, such that a process, method, object, or device including a list of elements include not only those elements but also other elements not explicitly listed or inherent to such process, method, object, or device. Without further limitation, an element defined by the phrase "comprising a/an . . . " does not exclude the presence of other identical elements in the process, method, object, or device including the element.

The foregoing serial numbers of the embodiments of the present disclosure are merely for description and do not represent any superiority or inferiority of the embodiments.

The methods disclosed by the embodiments of present disclosure in terms of methods can be combined with each other on a non-conflict basis to obtain embodiments of methods.

The features disclosed by the embodiments of present disclosure in terms of products can be combined with each other on a non-conflict basis to obtain new embodiments of products.

The features disclosed by the embodiments of present disclosure in terms of methods or devices can be combined with each other on a non-conflict basis to obtain new embodiments of methods or devices.

It should be noted that the foregoing is merely a description of the preferred embodiments of the present disclosure, and the scope of the present disclosure is not limited thereto. Variations and substitutions within the technical scope of the present disclosure are apparent to those skilled in the art, which shall be covered by the scope of the present disclosure. The scope of the disclosure is determined by the scope of the claims.

According to embodiments of the present disclosure, an input sampling method includes the following operations. A first pulse signal and a second pulse signal are received. Logical operation is performed on the first pulse signal and the second pulse signal to determine a to-be-sampled signal. The to-be-sampled signal is obtained by shielding an invalid part of the second pulse signal according to a logical operation result. Sampling process is performed on the to-be-sampled signal to obtain a target sampled signal. Therefore, by performing logical operation on the first pulse signal and the second pulse signal, the invalid part of the second pulse signal can be shielded, so that the to-be-sampled signal will not be flipped over in level state along with the invalid signals in the first pulse signal, thereby reducing the power and energy consumption of the input sampling circuit.

What is claimed is:

1. An input sampling method, comprising:
receiving a first pulse signal and a second pulse signal;
performing a logical operation on the first pulse signal and the second pulse signal to determine a to-be-sampled signal, wherein the to-be-sampled signal is obtained by shielding an invalid part of the second pulse signal according to a logical operation result;
performing sampling process on the to-be-sampled signal to obtain a target sampled signal;

when the logical operation result indicates that the second pulse signal is invalid, determining that a level state of the to-be-sampled signal is shielded to be a preset value; and when the logical operation result indicates that the second pulse signal is valid, determining that the level state of the to-be-sampled signal is the same as a level state of the second pulse signal.

2. The input sampling method of claim 1, wherein performing logical operation on the first pulse signal and the second pulse signal to determine the to-be-sampled signal comprises:

performing logical NOT operation on the second pulse signal to obtain a processed second pulse signal; and performing logical NOR operation on the first pulse signal and the processed second pulse signal to obtain the to-be-sampled signal.

3. The input sampling method of claim 1, wherein performing sampling process on the to-be-sampled signal to obtain the target sampled signal comprises:

receiving a standard clock signal; and performing sampling process on the to-be-sampled signal by using the standard clock signal to obtain the target sampled signal.

4. The input sampling method of claim 1, further comprising:

performing decoding process on the target sampled signal to obtain a target signal.

5. The input sampling method of claim 4, wherein performing decoding process on the target sampled signal to obtain the target signal comprises:

determining a sampled first pulse signal, wherein the sampled first pulse signal is obtained by performing sampling process on the first pulse signal by using a standard clock signal; and performing decoding process on the target sampled signal according to the sampled first pulse signal to obtain the target signal.

6. The input sampling method of claim 1, wherein the first pulse signal is a Chip Select (CS) signal; and accordingly, wherein the method further comprises:

when the CS signal is at high level, determining that the logical operation result indicates that the second pulse signal is invalid; and when the SC signal is at low level, determining that the logical operation result indicates that the second pulse signal is valid.

7. The input sampling method of claim 1, wherein the second pulse signal is a control signal or Address signal.

8. An input sampling circuit, comprising:

a first signal input terminal, configured to receive a first pulse signal;

a second signal input terminal, configured to receive a second pulse signal;

a logical operator, configured to perform a logical operation on the first pulse signal and the second pulse signal to obtain a to-be-sampled signal, wherein the to-be-sampled signal is obtained by shielding an invalid part of the second pulse signal according to a logical operation result; and a first sampling sub-circuit, configured to perform sampling process on the to-be-sampled signal to obtain a target sampled signal, wherein two input terminals of the logical operator are connected to the first signal input terminal and the second signal input terminal respectively, and an output terminal of the logical operator is connected to the first sampling sub-circuit, wherein the input sampling circuit further comprises a second sampling sub-circuit, wherein the second sampling sub-circuit comprises a fourth signal input terminal and a second sampler, the fourth signal input terminal is connected to a clock port of the second sampler, and an input terminal of the second sampler is connected to the first signal input terminal;

wherein the fourth signal input terminal is configured to receive a standard clock signal; and wherein the second sampler is configured to perform sampling process on the first pulse signal by using the standard clock signal to obtain a sampled first pulse signal.

9. The input sampling circuit of claim 8, wherein the logical operator comprises a NOT gate and a NOR gate;

the NOT gate is configured to perform logical NOT operation on the second pulse signal to obtain a processed second pulse signal;

the NOR gate is configured to perform logical NOR operation on the first pulse signal and the processed second pulse signal to obtain the to-be-sampled signal; and an input terminal of the NOT gate is connected to the second signal input terminal, a first input terminal of the NOR gate is connected to the first signal input terminal, and a second input terminal of the NOR gate is connected to an output terminal of the NOT gate.

10. The input sampling circuit of claim 8, wherein the first sampling sub-circuit comprises a third signal input terminal and a first sampler, the third signal input terminal is connected to a clock port of the first sampler, and an input terminal of the first sampler is connected to an output terminal of the logical operator;

wherein the third signal input terminal is configured to receive the standard clock signal; and wherein the first sampler is configured to perform sampling process on the to-be-sampled signal by using the standard clock signal to obtain the target sampled signal.

11. The input sampling circuit of claim 8, further comprising a decoder, wherein two input terminals of the decoder are connected to an output terminal of the first sampling sub-circuit and an output terminal of the second sampling sub-circuit respectively; and wherein the decoder is configured to perform decoding process on the target sampled signal according to the sampled first pulse signal to obtain a target signal.

12. A semiconductor memory comprising an input sampling circuit, wherein the input sampling circuit comprises:

a first signal input terminal, configured to receive a first pulse signal;

a second signal input terminal, configured to receive a second pulse signal;

a logical operator, configured to perform a logical operation on the first pulse signal and the second pulse signal to obtain a to-be-sampled signal, wherein the to-be-sampled signal is obtained by shielding an invalid part of the second pulse signal according to a logical operation result; and a first sampling sub-circuit, configured to perform sampling process on the to-be-sampled signal to obtain a target sampled signal, wherein two input terminals of the logical operator are connected to the first signal input terminal and the second signal input terminal respectively, and an output terminal of the logical operator is connected to the first sampling sub-circuit,
wherein the input sampling circuit further comprises a second sampling sub-circuit, wherein the second sampling sub-circuit comprises a fourth signal input terminal and a second sampler, the fourth signal input terminal is connected to a clock port of the second sampler, and an input terminal of the second sampler is connected to the first signal input terminal;
wherein the fourth signal input terminal is configured to receive a standard clock signal; and
wherein the second sampler is configured to perform sampling process on the first pulse signal by using the standard clock signal to obtain a sampled first pulse signal.

13. The semiconductor memory of claim 12, wherein the logical operator comprises a NOT gate and a NOR gate;
the NOT gate is configured to perform logical NOT operation on the second pulse signal to obtain a processed second pulse signal;
the NOR gate is configured to perform logical NOR operation on the first pulse signal and the processed second pulse signal to obtain the to-be-sampled signal; and
an input terminal of the NOT gate is connected to the second signal input terminal, a first input terminal of the NOR gate is connected to the first signal input terminal, and a second input terminal of the NOR gate is connected to an output terminal of the NOT gate.

14. The semiconductor memory of claim 12, wherein the first sampling sub-circuit comprises a third signal input terminal and a first sampler, the third signal input terminal is connected to a clock port of the first sampler, and an input terminal of the first sampler is connected to an output terminal of the logical operator;
wherein the third signal input terminal is configured to receive the standard clock signal; and
wherein the first sampler is configured to perform sampling process on the to-be-sampled signal by using the standard clock signal to obtain the target sampled signal.

15. The semiconductor memory of claim 12, further comprising a decoder, wherein two input terminals of the decoder are connected to an output terminal of the first sampling sub-circuit and an output terminal of the second sampling sub-circuit respectively; and
wherein the decoder is configured to perform decoding process on the target sampled signal according to the sampled first pulse signal to obtain a target signal.

* * * * *